(12) United States Patent
Mason et al.

(10) Patent No.: US 12,293,795 B2
(45) Date of Patent: May 6, 2025

(54) MANAGING DEFECTIVE BLOCKS DURING MULTI-PLANE PROGRAMMING OPERATIONS IN MEMORY DEVICES

(71) Applicant: Micron Technology, Inc., Boise, ID (US)

(72) Inventors: Robert W. Mason, Boise, ID (US); Scott Anthony Stoller, Boise, ID (US); Pitamber Shukla, Boise, ID (US); Ekamdeep Singh, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 311 days.

(21) Appl. No.: 17/897,441

(22) Filed: Aug. 29, 2022

(65) Prior Publication Data
US 2024/0071528 A1    Feb. 29, 2024

(51) Int. Cl.
*G06F 3/06* (2006.01)
*G11C 16/10* (2006.01)
*G11C 16/34* (2006.01)

(52) U.S. Cl.
CPC .......... *G11C 16/3459* (2013.01); *G06F 3/064* (2013.01); *G11C 16/102* (2013.01); *G11C 16/3495* (2013.01)

(58) Field of Classification Search
CPC .............. G11C 16/3459; G11C 16/102; G11C 16/3495; G11C 29/4401; G11C 29/883; G11C 2029/0409; G11C 16/3454; G11C 16/10; G06F 3/064
See application file for complete search history.

(56) References Cited

U.S. PATENT DOCUMENTS

| | | | |
|---|---|---|---|
| 2012/0185738 A1* | 7/2012 | Gyllenskog | G06F 11/108 714/54 |
| 2023/0153001 A1* | 5/2023 | Shim | G06F 3/0631 711/154 |

* cited by examiner

*Primary Examiner* — Jay W. Radke
(74) *Attorney, Agent, or Firm* — Lowenstein Sandler LLP (57) ABSTRACT

Systems and methods are disclosed including a memory device and a processing device operatively coupled to the memory device. The processing device can perform operations comprising performing a set of write operations on a first block in a first plane of the memory device and on a second block in a second plane of the memory device, performing a program verification check on the first block, responsive to determining that the first block fails the program verification check, incrementing a counter value associated with the second block; responsive to the counter value satisfying a threshold criterion, performing a failure verification operation on the second block, and responsive to determining that the second block fails the failure verification operation, retiring the second block.

20 Claims, 6 Drawing Sheets

| Program Cycle | Plane 0 | Plane 1 | Plane 2 | Plane 3 |
|---|---|---|---|---|
| 0 | 0 | 100 | 200 | 300 |
| 1 | 0 | 100 | 201 | 301 |
| 2 | 0 | 100 | 202 | 302 |
| 3 | 0 | 100 | 203 | 303 |

MANAGING DEFECTIVE BLOCKS DURING MULTI-PLANE PROGRAMMING OPERATIONS IN MEMORY DEVICES

TECHNICAL FIELD

Embodiments of the disclosure relate generally to memory sub-systems, and more specifically, relate to managing defective blocks during multi-plane programming operations in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to managing defective blocks during multi-plane programming operations in memory devices of a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane includes a set of physical blocks. Each block includes a set of pages. Each page includes a set of memory cells ("cells"). A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device includes multiple memory cells arranged in a two-dimensional or three-dimensional grid. Memory cells are formed on (e.g., etched onto) a silicon wafer in an array of columns connected by conductive lines (also hereinafter referred to as bitlines) and rows connected by conductive lines (also hereinafter referred to as wordlines). A wordline can refer to a conductive line that connects control gates of a set (e.g., one or more rows) of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. In another example, the memory device can include multiple access line driver circuits and power circuits that can be shared by the planes of the memory device. For ease of description, these circuits can be generally referred to as independent plane driver circuits. Depending on the storage architecture employed, data can be stored across the memory planes (e.g., in stripes). Accordingly, one request to read a segment of data (e.g., corresponding to one or more data addresses), can result in read operations performed on two or more of the memory planes of the memory device.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_t$ (also referred to as the "threshold voltage") such that the source-drain electric current is low for the control gate voltage ($V_{CG}$) being below the threshold voltage, $V_{CG}<V_t$. The current increases substantially once the control gate voltage has exceeded the threshold voltage, $V_{CG}>V_t$. Because the actual geometry of the electrodes and gates varies from cell to cell, the threshold voltages can be different even for cells implemented on the same die. The cells can, therefore, be characterized by a distribution P of the threshold voltages, $P(Q,V_t)=dW/dV_t$, where dW represents the probability that any given cell has its threshold voltage within the interval $[V_t, V_t+dV_t]$ when charge Q is placed on the cell.

A programming operation can include the application of a series of incrementally increasing programming pulses to a control gate of a memory cell being programmed. A program verify operation after each programming pulse determines the threshold voltage of the memory cell resulting from the preceding programming pulse. When memory cells are programmed, the level of the programming achieved in a cell (e.g., the $V_t$ of the cell) is verified, in effect, by comparing the cell $V_t$ to a target (i.e., desired) program verify (PV) voltage level. The PV voltage level can be provided by an external reference.

A typical program verify operation includes referring to a target threshold voltage and applying a ramped voltage to the control gate of the memory cell being verified. When the ramped voltage reaches the threshold voltage to which the memory cell has been programmed, the memory cell turns on and sense circuitry detects a current on a bit line coupled to the memory cell. The detected current activates the sense circuitry to compare whether the present threshold voltage is greater than or equal to the stored target threshold voltage. If the present threshold voltage is greater than or equal to the target threshold voltage, further programming is inhibited. Otherwise, programming typically continues in this manner with the application of additional program pulses to the memory cell until the target PV of a corresponding $V_t$ or data state is achieved.

In response to a program command, the memory device can perform concurrent program operations to program (e.g., write) the data referenced by the program command to one or more blocks of each plane of a stripe. In some instances, one or more of the blocks can be no longer reliable for storing or retrieving data due to a defect (e.g., manufacturing defect), due to wear, etc. One of these "bad blocks" on one plane can cause incorrect data to be programmed to other blocks on one or more other planes of the stripe. For example, a defective block on one plane due to a short circuit can cause a voltage drop in a programming pulse, resulting in the memory device compensating by increasing the pulse voltage to achieve the desired threshold voltage. However, this can cause the memory device to increase the pulse voltages in the program operations performed on the non-defective blocks of the other planes, resulting in programming errors in those blocks. During the verification process (e.g., performing program verify operations), the memory device may successfully verify the data programmed in the defective block, but conclude that the data programmed to the non-defective blocks of the other planes contains errors. This can cause the memory sub-system controller to retire (e.g., no longer use the blocks to store data) good blocks (e.g., blocks without defects) while maintaining the defective block.

Figure 2:
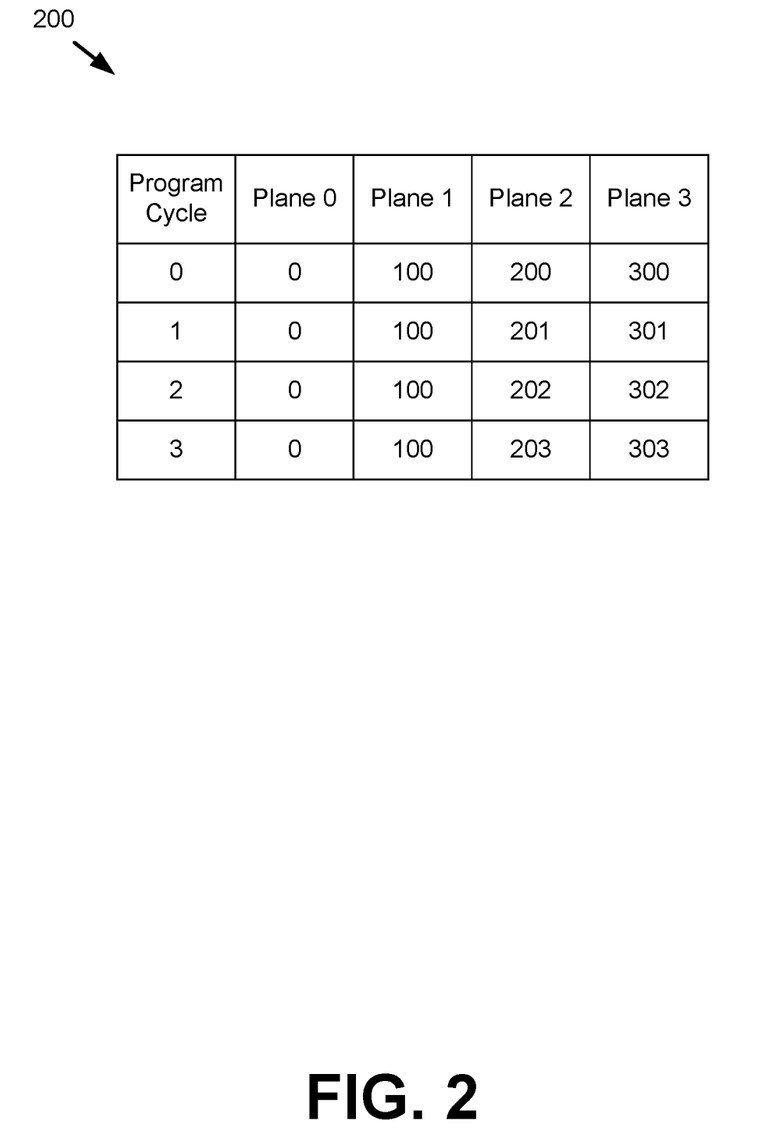
FIG. 2 is a table illustrating four example program cycles, in accordance with some embodiments of the present disclosure.

FIG. 2 shows an illustrative example of four program cycles (e.g., program cycle 0, 1, 2, and 3) shown in table 200. Block 0 can be defective, but can pass a program verify operation. During program cycle 0, the memory sub-system controller can program to block 0 of plane 0, block 100 of plane 1, block 200 of plane 2, and block 300 of plane 3. Block 0, although defective, can pass the program verify operation, and block 100 can be a good block that also passes the program verify operation. However, the defect to block 0 can cause blocks 200 and 300 to fail the program verify operation despite both blocks 200 and 300 being good blocks. In response, the memory sub-system controller can retire blocks 200 and 300, replace them with blocks 201 and 301, and initiate a subsequent program cycle (e.g., program cycle 1). Similarly, defective block 0 and good block 100 can pass the program verify operation, but blocks 201 and 301 can fail, despite being good blocks. This process can continue and erroneously retire a significant amount of good blocks without identifying the defective block.

Aspects of the present disclosure address the above and other deficiencies by managing defective blocks during multi-plane programming operations. In some embodiments, for each program cycle, the memory sub-system controller performs a verification check (e.g., via a program verify operation) on each block referenced by the program cycle. If one or more blocks fail the verification check, the memory sub-system controller can mark each failed block in a bad block (BB) data structure, and keep track of the blocks that passed the verification check in an incident data structure. For each passed block, the memory sub-system controller can further increment an incident counter, in the incident data structure, for each passed block during each program cycle that included a failed block. For example, referencing FIG. 2, during program cycle 0 where blocks 200 and 300 failed, blocks 0 and 100 can be marked in the incident data structure and the incident counters for blocks 0 and 100 can be incremented (e.g., by a value of 1). The memory sub-system controller can continue performing program cycles by replacing failed blocks with new blocks of the respective same plane until an incident counter for a block satisfies a threshold criterion (e.g., meets or exceeds a threshold value).

The memory sub-system controller can then perform a failure verification operation to determine whether the block identified by the incident counter is defective. In the failure verification operation, in some embodiments, the memory sub-system controller can perform a single-plane verification operation that can include performing a data integrity check on the block identified as having an incident counter value that satisfies a threshold criterion. A data integrity check can include an operation used to verify that the data stored at the block can be reliably read. In some embodiments, the data integrity check can include reading data from a set of sampled memory cells in the block. The data integrity check can verify that the data stored at memory cells does not include any errors, or that the number of errors are suitably low. In one example, the memory sub-system controller identifies a data integrity metric, such as the bit error count (BEC) or the raw bit error rate (RBER), representing a number of bit errors per unit of time that the data stored at the data block experiences. The memory sub-system controller can then determine whether a value of the data integrity metric (e.g., a BEC value, a RBER value, etc.) satisfies a threshold criterion (e.g., meets or exceeds a threshold value). Responsive to the data integrity check satisfying the threshold criterion (e.g., BEC or RBER value is above a threshold value), the memory sub-system controller can retire the identified block by marking the block in the BB data structure.

In the failure verification operation, in some embodiments, the memory sub-system controller can perform a multi-plane verification operation that includes performing a set of program cycles on a set of blocks, where during each of the program cycles, a different block of the set of blocks is swapped for a control block. For each program cycle, the processing logic can perform a verification check on each block referenced by said program cycle. In an instance where each block of a program cycle passes the verification check, the processing logic can identify the swapped out block as defective. This is because the defective block is swapped out and not causing, for example, a voltage drop in a programming pulse that affects other blocks. Once the defective block is identified, the memory sub-system controller can identify one or more good blocks that were erroneously marked as a failed block in the BB data structure, and place the good blocks into the pool of available blocks to program. To identify these good blocks, the memory sub-system controller can perform a lookup of blocks associated with the identified defective block from one or more previous program cycles using, for example, a lookup table.

In some embodiments, responsive to a verification check of a set of blocks in a program cycle detecting a failed block, the memory sub-system controller can mark each block referenced by the program cycle in the BB data structure. The memory sub-system controller can then continue performing the write operations on a different set of blocks, and perform a failure verification operation on the marked blocks during subsequent maintenance operations. This can reduce latency during programming operations in the memory sub-system.

Advantages of the systems and methods implemented in accordance with some embodiments of the present disclosure include, but are not limited to, a reduction in complexity and improvement in performance of performing managing failed blocks during programming operations. This increase in performance includes reduced latency, particularly when the processing device needs to perform no failure verification operations during programming operations. The method and system in accordance with some embodiments of the present disclosure further reduce the amount of good blocks that are retired due to erroneously being marked as a bad block. Other advantages will be apparent to those skilled in the art of managing defective blocks within memory devices, which will be discussed hereinafter. Although embodiments are described using blocks of a NAND flash memory, aspects of the present disclosure can be applied to other types of memory sub-systems.

Figure 1:
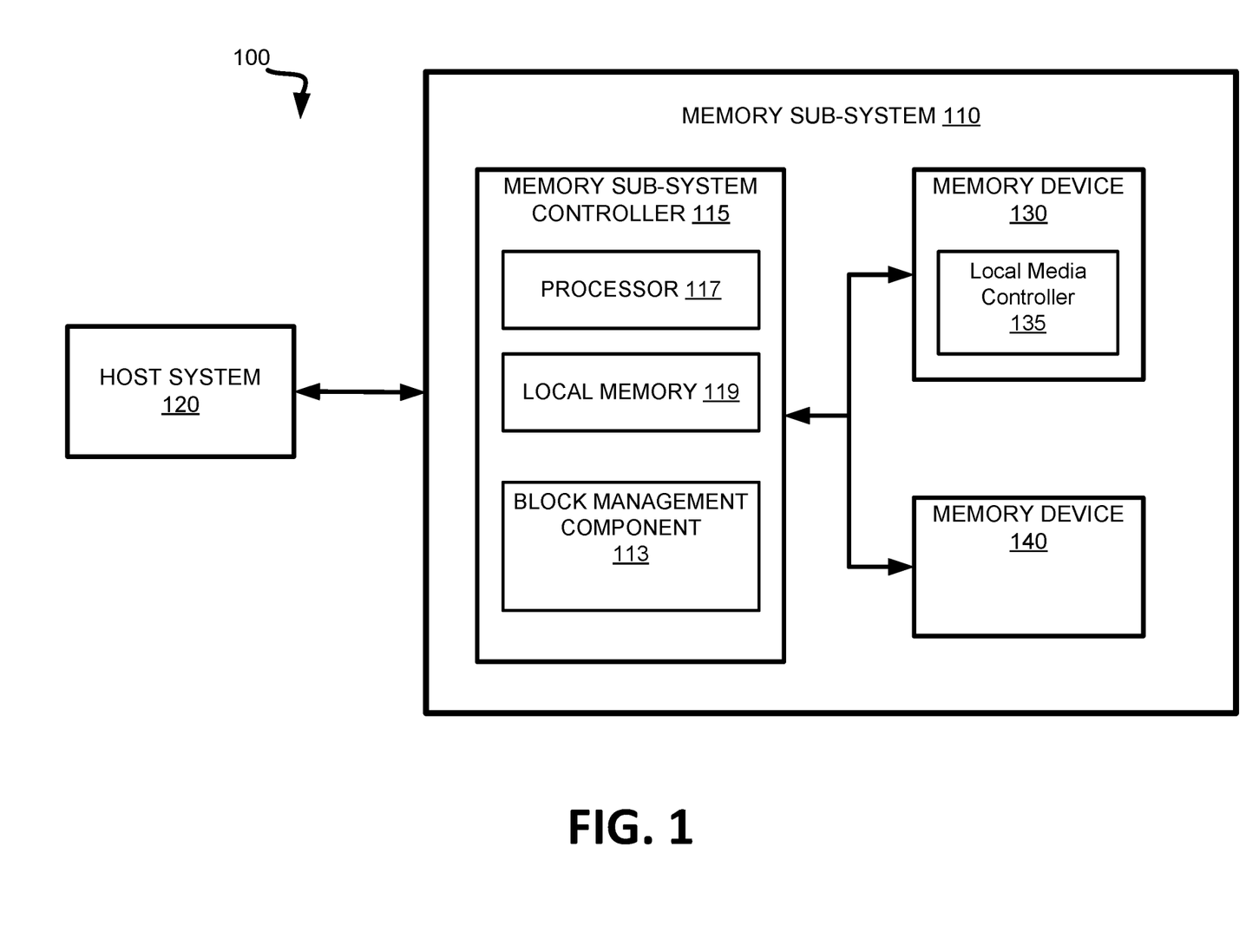
FIG. 1 illustrates an example computing system that includes a memory sub-system, in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a block management component (BMC) 113 that can manage blocks in response to detecting errors or verification issues during multi-plane programming operations in the memory device 130. In some embodiments, the memory sub-system controller 115 includes at least a portion of the BMC 113. In some embodiments, the BMC 113 is part of the host system 110, an application, or an operating system. In other embodiments, local media controller 135 includes at least a portion of BMC 113 and is configured to perform the functionality described herein.

Figure 3:
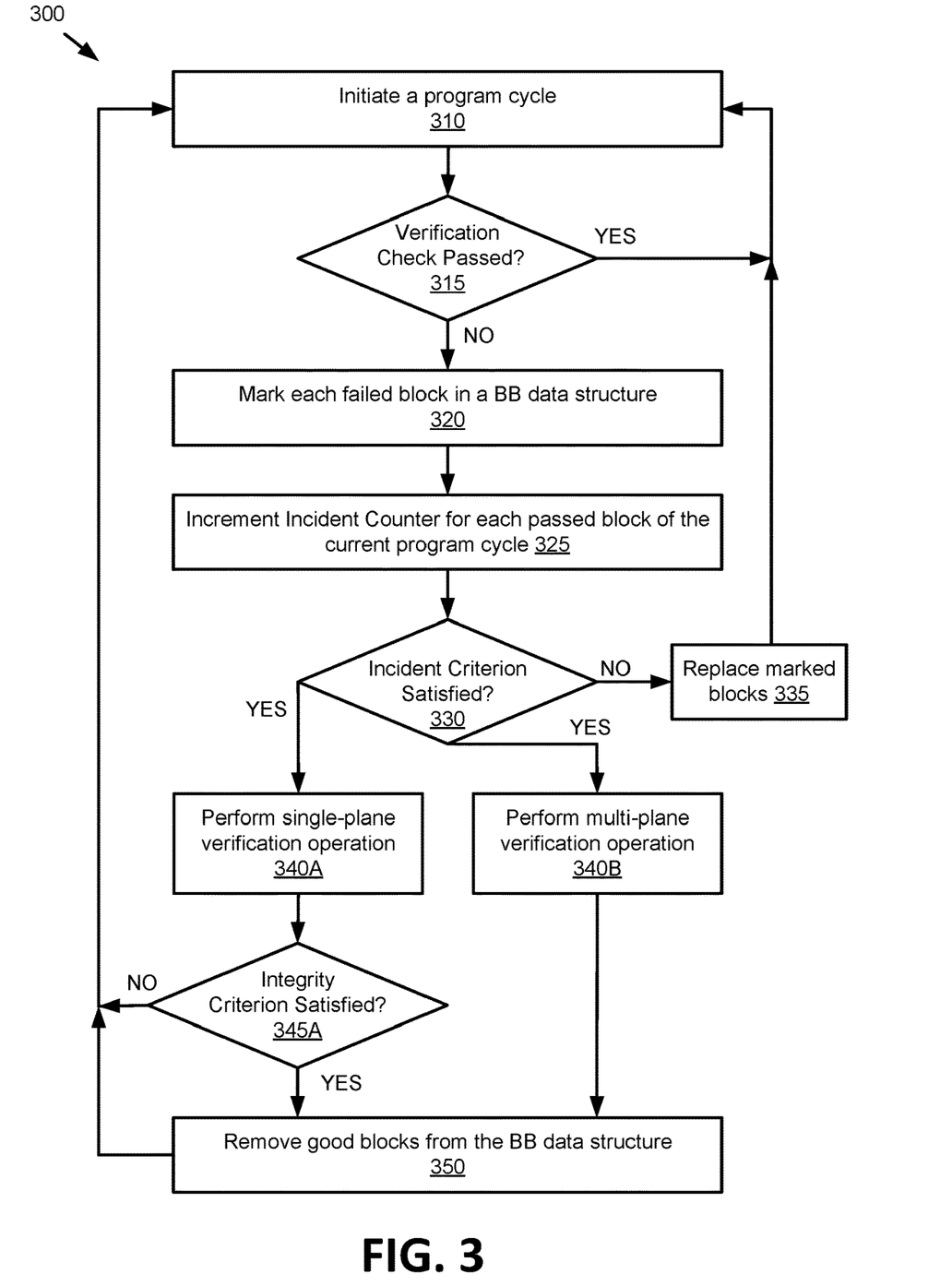
FIG. 3 is flow diagram of an example method for identifying defective blocks during multi-plane programming operations, in accordance with some embodiments of the present disclosure.

FIG. 3 is a flow diagram of an example method 300 for identifying defective blocks during multi-plane programming operations, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the BMC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic initiates a program cycle. The program cycle can include a set of write operations performed on blocks of respective planes of a stripe. For example, referencing FIG. 2, during program cycle 0, the processing logic can program data to block 0 of plane 0, to block 100 of plane 1, to block 200 of plane 2, and to block 300 of plane 3.

At operation 315, the processing logic performs a program verification check on each block referenced by the program cycle. In some embodiments, the processing logic can perform a program verification check by performing a program verify operation, by determining whether a program failure occurred, by detecting whether a read operation on the programmed block produces a read failure (e.g., the data is unreadable during a read operation or the read data contains read errors), or by any other operation capable of determining whether data was programmed to a block.

Responsive to determining that the each block referenced by the program cycle passed the program verification check, the processing logic proceeds to operation 310, where the processing logic performs a subsequent program cycle. Responsive to determining that at least one block failed the program verification check (referred to as a failed block), the processing logic proceeds to operation 320.

Figure 4A:
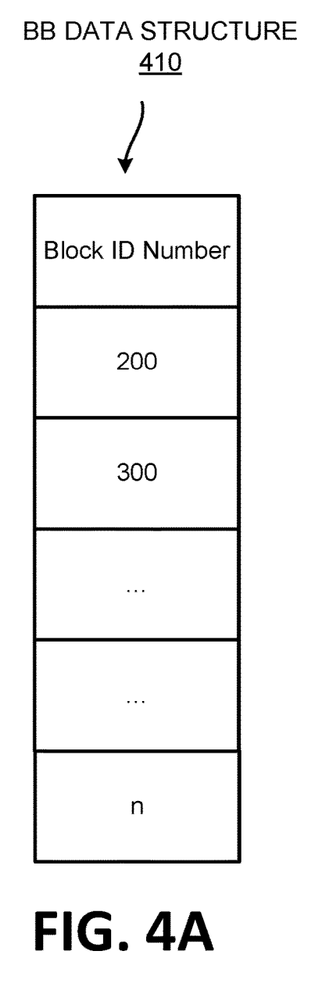
FIG. 4A shows an illustrative example of a bad block data structure, in accordance with some embodiments of the present disclosure

At operation 320, the processing logic marks each failed block in a bad block (BB) data structure. In some embodiments, the processing logic can record the identifier (ID) of the block in the BB data structure. A data structure can be a metadata table, a look-up table, a database, or any other structure capable of storing a collection of data values, the relationships among them, and the functions or operations that can be applied to the data values. The BB data structure can include a list of ID numbers for each block that has been identified as a BB. The BB data structure can be maintained by the media management component 113 and used to track blocks that failed during a program cycle. FIG. 4A shows an illustrative example of BB data structure 410, which include a listing of block ID numbers (e.g., block 200 and block 300) which have been identified as BBs. Blocks marked in the BB data structure can be considered retired blocks that will no longer used to store data by the processing logic. In an example and in reference to program cycle 0, the processing logic can mark blocks 200 and 300 in the BB data structure.

Figure 4B:
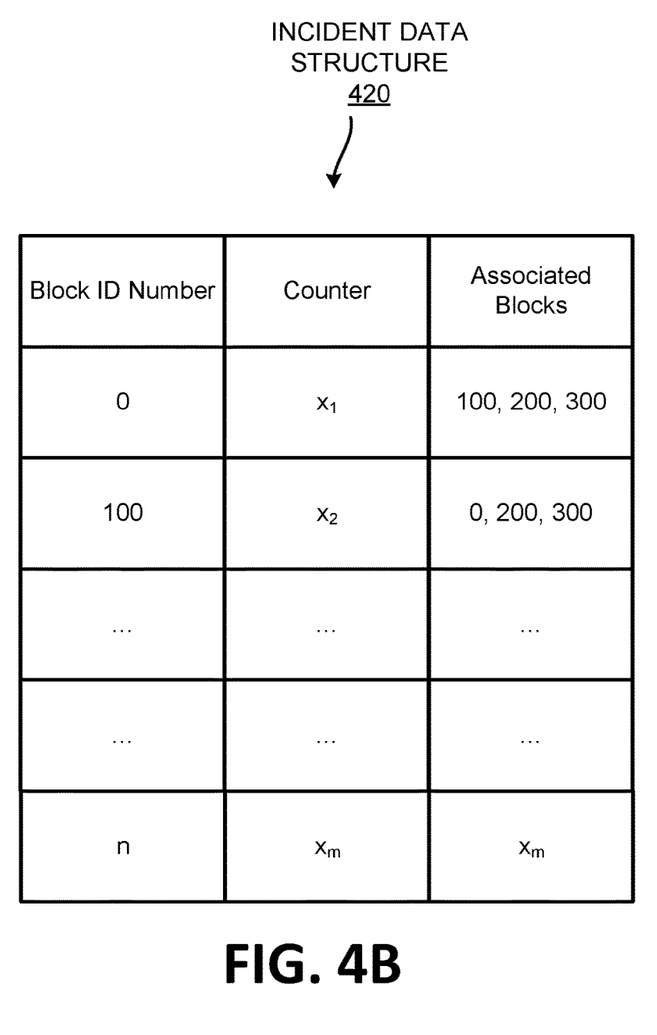
FIG. 4B shows an illustrative example of an incident data structure, in accordance with some embodiments of the present disclosure.

At operation 325, the processing logic increments an incident counter, in an incident data structure, for each passed block of the current program cycle. The incident counter can reflect each occurrence of a block passing the program verification check, but being identified in a program cycle that includes at least one failed block. In an illustrative example referencing FIG. 2, during program cycle 0 where blocks 200 and 300 failed, the incident counters for blocks 0 and 100 can be incremented. The incident data structure can include a list of ID numbers for each block that has been identified as a non-failed block in a program cycle that included one or more failed blocks, along with a corresponding counter value (e.g., 1, 2, 3, and so forth). The incident data structure can be maintained by the media management component 113. FIG. 4B shows an illustrative example of incident data structure 420, which include a listing of block ID numbers (e.g., block 0 and block 100) and their corresponding incident counter value (e.g., $x_1$, $x_2$, etc.). In some embodiments, the incident data structure can further include a list of blocks that were associated with the incremented block during a program cycle. For example, as shown in FIG. 4B, block 0 can include a listing of the other blocks that were part of the program cycle 0 (e.g., 100, 200, 300). In some embodiments, the associated blocks of each program cycle that caused the counter value for a block to increase can be listed in a separate listing. For example, each listed block ID can include the associated block of the corresponding program cycle for each instance that a block's counter value increases.

At operation 330, the processing logic determines whether a counter value in the incident data structure satisfies an incident threshold criterion. In some embodiments, the processing logic can determine whether an incident counter value exceeds a threshold criterion. For example, if the threshold value is two, and a counter value is set to three, the processing logic can determine that the incident threshold criterion is satisfied. Responsive to the processing logic determining that the incident threshold criterion is not satisfied (e.g., no incident counter values exceed a threshold value), the processing logic proceeds to operation 335. In some embodiments (shown), responsive to the processing logic determining that the threshold criterion is satisfied (e.g., one or more incident counter values exceed a threshold value), the processing logic proceeds to operation 340A or 340B. In other embodiments (not shown), responsive to the processing logic determining that the threshold criterion is satisfied (e.g., one or more incident counter values exceed a threshold value), the processing logic can mark the block identified by the counter value in the BB data structure and then proceed to operation 335. In some embodiments, the processing logic can then proceed to operation 340A or 340B during a subsequent maintenance operation, upon completion of a subsequent programming operation, etc. In some embodiments, the processing logic can perform validation check using an internal test sequence, or other similar operations.

At operation 335, the processing logic replaces the blocks marked in the BB data structure for a subsequent program cycle. For example, the processing logic can replace each block marked in the BB data structure with another block from the respective plane. Referring to FIG. 2, the processing logic can, for program cycle 1, replace block 200 with block 201 from plane 2, and replace block 300 with block 301 from plane 3. The processing logic can then proceed to operation 310 and perform a subsequent program cycle (e.g., program cycle 1).

At operations 340A and 340B, the processing logic performs a failure verification operation. A failure verification operation can include an operation to identify a defective block. At operation 340A, the failure verification operation can include a single-plane verification operation. At operation 340B, the failure verification operation can include a multi-plane verification operation.

Referring to operation 340A, the single-plane verification operation can include performing a data integrity check on a block(s) identified as having an incident counter value that exceed a threshold value. The processing logic can perform the data integrity check on at least a portion of the data from the identified block. In some embodiments, the data integrity check can include reading data from a set of sampled memory cells in the set of blocks. In some embodiments, the set of sampled memory cells in the blocks can be one or more memory cells, pages, a wordlines, a group of wordlines in the block, a data portion, or any combination thereof. In some embodiments, the set of sampled memory cells can be selected randomly, can be a predetermined group (e.g., the first, twentieth, and fortieth page of the block), can be a rotating group, etc.

The data integrity check can verify that the data stored at memory cells does not include any errors, or that the number of errors are below a predetermined threshold. During a scan operation, the processing logic identifies one or more data integrity metrics, such as the bit error count (BEC) or the raw bit error rate (RBER), representing a number of bit errors per unit of time that the data stored at the data block experiences. In some embodiments, during the data integrity check, the processing logic reads a raw code word (i.e., a series of a fixed number of bits) from the page. The processing logic can apply the code word to an error correcting code (ECC) decoder to generate a decoded code word and compare the decoded code word to the raw code word. The processing logic can count a number of flipped bits between the decoded code word and the raw code word, with a ratio of the number of flipped bits to the total number of bits in the code word representing the RBER.

At operation 345A, the processing logic determines whether a value of the data integrity metric (e.g., a BEC value, a RBER value, etc.) satisfies a threshold criterion (e.g., meets or exceeds a threshold value, is lower than a threshold value, etc.). The threshold criterion can be determined and set during manufacturing of the memory sub-system 110 or during programming and/or calibration of the memory sub-system 110. In an example, the processing logic can determine whether an RBER value or a BEC value exceeds a threshold value. If the data integrity metric satisfies a threshold criterion (e.g., BEC or RBER value is above a threshold value), the processing logic proceeds to operation 350. If the data integrity metric fails to satisfy the threshold criterion (e.g., BEC or RBER value is below a threshold value), the processing logic proceeds to operation 310, and perform a subsequent program cycle. In some embodiments, responsive to the data integrity metric failing to satisfy the threshold criterion, the processing logic can reset the incident counter for the identified block.

Referring to operation 340B, the multi-plane verification operation can include performing a set of program cycles on a set of blocks, where during each of the program cycles, a different block of the set of block is swapped for a control block. The control block can be a predetermined block, a random un-programmed block, etc. For each program cycle, the processing logic can perform a program verification check on each block referenced by the program cycle. In an instance where each block of a program cycle passes the program verification check, the processing logic can identify the swapped out block as defective.

In an illustrative example, during the initial program cycle of the multi-plane verification operation, the processing logic can perform a program operation on blocks 0, 100, 200, and the control block. Although block 0 is defective, due to the nature of the defect, block 0 and block 100 can pass the program verification check, block 200 can fail the program verification check, and the control block can pass or fail the program verification check. During the next program cycle of the multi-plane verification operation, the processing logic can swap block 200 with idle block 300, and perform a program operation on blocks 0, 100, 300, and the control block. Again, due to the nature of the defect, block 0 and block 100 can pass the program verification check, block 300 can fail the program verification check, and the control block can pass or fail the program verification check. During the next program cycle of the multi-plane verification operation, the processing logic can swap block 100 with idle block 200, and perform a program operation on blocks 0, 200, 300, and the control block. Here, block 0 can pass the program verification check, blocks 200 and 300 can fail the program verification check, and the control block can pass or fail the program verification check. During the last program cycle of the multi-plane verification operation, the processing logic can swap block 0 with idle block 100, and perform a program operation on blocks 100, 200, 300, and the control block. Due to defective block 0 being removed from this program cycle, each block (e.g., block 100, 200, 300 and the control block) can pass the program verification check. Accordingly, the processing logic can identify block 0 as a defective block. The defective block can be marked in the BB data structure.

At operation 350, the processing logic removes good block(s) from the BB data structure. In particular, the processing logic can first identify one or more good blocks that were erroneously marked as a failed block in the BB data structure. To identify a good block, the processing logic performs a lookup of blocks associated with the identified defective block from one or more previous program cycles. For example, the processing logic can use incident data structure 420 to identify blocks 100, 200, and 300 as block blocks associated with defective block 0. The processing logic can then perform a lookup in the BB data structure for the identified associated blocks. For example, the processing logic can perform a lookup in BB data structure 410 to identify blocks 200 and 300. The processing logic can then remove the identified associated blocks from the BB data structure. The processing logic then proceeds to operation 310, where the processing logic performs a subsequent program cycle. During said subsequent program cycle, the defective block (e.g., block 0) will be retired and no longer used to store data by the processing logic, whereas the good blocks (e.g., 100, 200, 300) will be available for programming.

Figure 5:
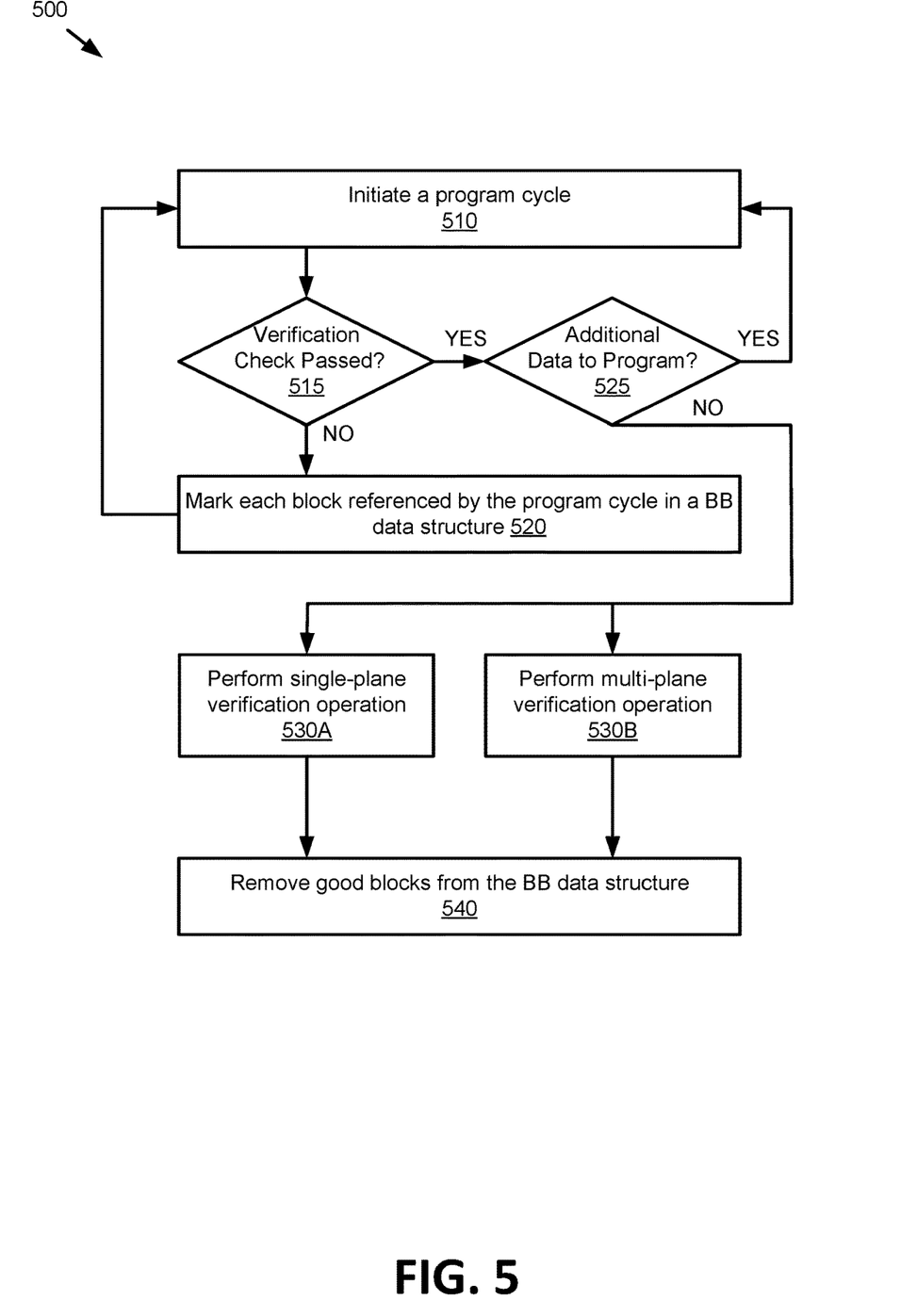
FIG. 5 is a flow diagram of another example method f for identifying defective blocks during multi-plane programming operations, in accordance with some embodiments of the present disclosure.

FIG. 5 is a flow diagram of another example method 500 for identifying defective blocks during multi-plane programming operations, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the media management component of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic initiates a program cycle. The program cycle can include a set of write operations performed on blocks of respective planes of a stripe. For example, referencing FIG. 2, during program cycle 0, the processing logic can program data to block 0 of plane 0, to block 100 of plane 1, to block 200 of plane 2, and to block 300 of plane 3.

At operation 515, the processing logic performs a program verification check on each block referenced by the program cycle. In some embodiments, the processing logic can perform a program verification check by performing a program verification operation, by determining whether a program failure occurred, by detecting whether a read operation on the programmed block produces a read failure (e.g., the data is unreadable during a read operation or the read data contains read errors), or by any other operation capable of determining whether data was accurately programmed to a block. Responsive to determining that at least one block failed the program verification check (referred to as a failed block), the processing logic proceeds to operation 520.

At operation 520, the processing logic marks each block referenced by the program cycle in a BB data structure. For example, in reference to program cycle 0, the processing logic can mark blocks 0, 100, 200, and 300 in the BB data structure. The processing logic then proceeds to operation 510, where the processing logic performs a subsequent program cycle on a new set of blocks.

Returning to operation 515, responsive to determining that each block referenced by the program cycle passed the program verification check, the processing logic proceeds to operation 525, where the processing logic determines whether there is additional data to program to the memory device. For example, the processing logic can determine whether a queue includes additional write commands (or read commands). Responsive to determining that there is additional data to program (or pending host-initiated read commands), the processing logic proceeds to operation 510, where the processing logic initiates a subsequent program cycle (or initiates a read operation). Responsive to determining that there is no additional data to program (or no pending host-initiated read commands), the processing logic proceeds to operation 530A-B. In some embodiments, the processing logic can proceed to operation 530A-B after operation 520 (not shown).

At operations 530A and 530B, the processing logic performs a failure verification operation. A failure verification operation can include an operation to identify a defective block. At operation 530A, the failure verification operation can include a single-plane verification operation. At operation 530B, the failure verification operation can include a multi-plane verification operation.

Referring to operation 530A, the single-plane verification operation can include performing a data integrity check on each block of the program cycle where at least one block failed the program verification check (referred to as a failed program cycle). The data integrity check can verify that the data stored at a set of memory cells of each block does not include any errors, or that the number of errors are below a predetermined threshold. For each block of the failed program cycle, the processing logic determines whether a value of the data integrity metric (e.g., a BEC value, a RBER value, etc.) satisfies a threshold criterion (e.g., meets or exceeds a threshold value, is lower than a threshold value, etc.). If the data integrity metric satisfies a threshold criterion (e.g., BEC or RBER value is above a threshold value), the processing logic maintains the block in the BB data structure (e.g., retired the block). If the data integrity metric fails to satisfy the threshold criterion (e.g., BEC or RBER value is below a threshold value), the processing logic proceeds to operation 540, where the processing logic removes the block from the BB data structure.

Referring to operation 530B, the multi-plane verification operation can include performing a set of program cycles on a set of blocks, where during each of the program cycles, a different block of the set of block is swapped for a control block. The control block can be a predetermined block (e.g., as a part of the firmware code, determined by-die as a part of the manufacturing process, etc.), a random un-programmed block, a block with similar cycling behavior as seen from system performance, etc. For each program cycle, the processing logic can perform a program verification check on each block referenced by the program cycle. In an instance where each block of a program cycle passes the program verification check, the processing logic can identify the swapped out block as defective. The identified defective block can be maintained in the BB data structure. The remaining good blocks can be, at operation 540, removed from the BB data structure to be made available for future programming operations.

Figure 6:
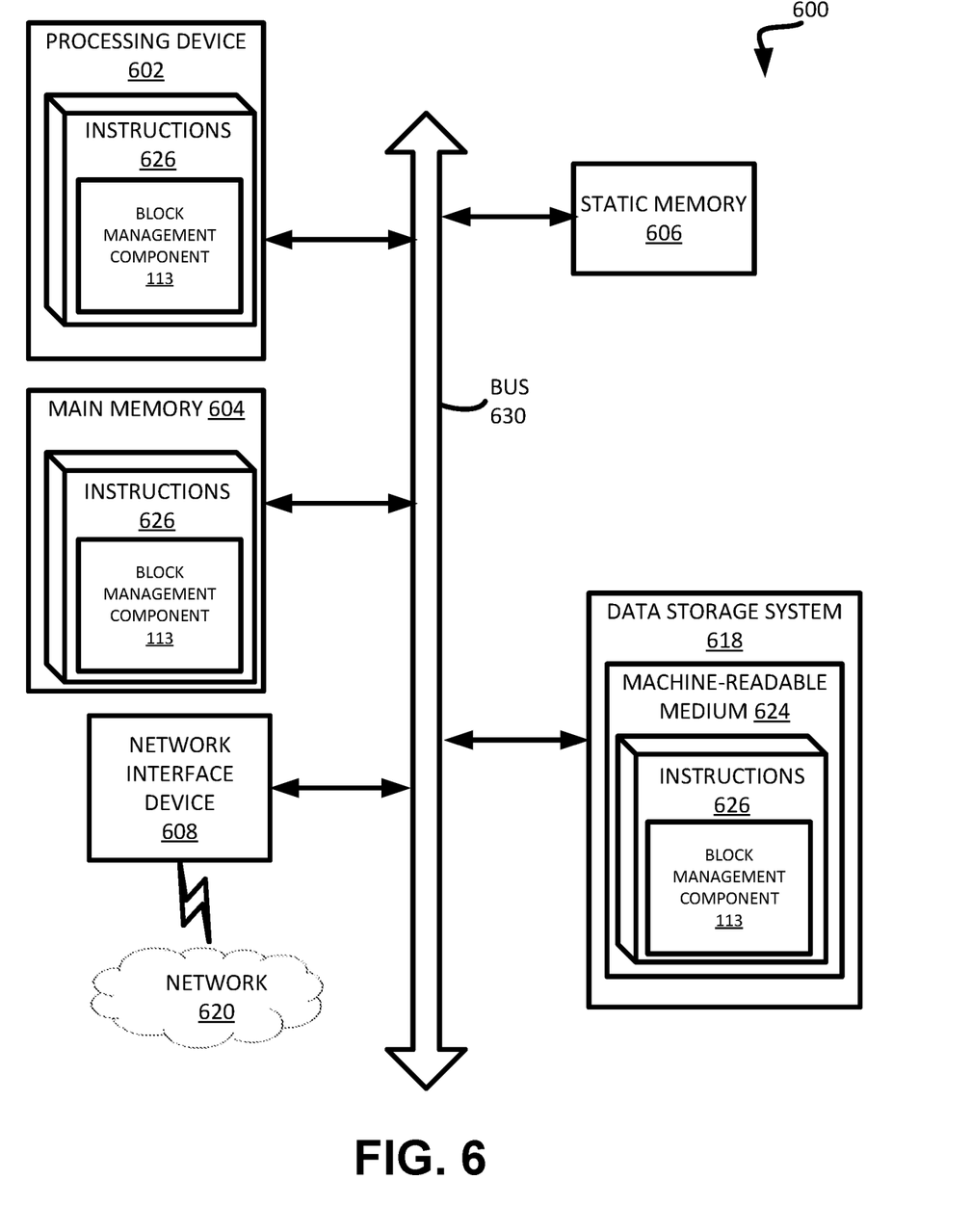
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to BMC 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a compensation management component (e.g., the BMC 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
performing a set of write operations on a first block in a first plane of the memory device and on a second block in a second plane of the memory device;
performing a program verification check on the first block;
responsive to determining that the first block fails the program verification check, incrementing a counter value associated with the second block;
responsive to the counter value satisfying a threshold criterion, performing a failure verification operation on the second block; and
responsive to the failure verification operation determining that the second block is defective, retiring the second block.

2. The system of claim 1, wherein the processing device is to perform further operations comprising:
responsive to determining that the first block fails the program verification check, adding an indication of the first block to a bad block data structure associated with retired blocks; and
responsive to determining that the second block fails the failure verification operation, removing the indication of the first block from the bad block data structure.

3. The system of claim 1, wherein performing the failure verification operation comprises performing a data integrity check on the second block.

4. The system of claim 1, wherein performing the failure verification operation comprises:
 programming data to the first block and a third block; and
 performing a program verification check on the first block and the third block.

5. The system of claim 4, wherein the processing device is to perform further operations comprising:
 responsive to determining that the first block and the third block pass the program verification check, determining that the second block fails the failure verification operation.

6. The system of claim 1, wherein the processing device is to perform further operations comprising:
 responsive to determining that the first block fails the program verification check, retiring the first block and the second block.

7. The system of claim 1, wherein the processing device is to perform further operations comprising:
 responsive to determining that the second block passes the failure verification operation, resetting the counter value.

8. A method comprising:
 performing, by a processor, a set of write operations on a first block in a first plane of a memory device and on a second block in a second plane of the memory device;
 performing a program verification check on the first block;
 responsive to determining that the first block fails the program verification check, incrementing a counter value associated with the second block;
 responsive to the counter value satisfying a threshold criterion, performing a failure verification operation on the second block; and
 responsive to the failure verification operation identifying that the second block is defective, retiring the second block.

9. The method of claim 8, further comprising:
 responsive to determining that the first block fails the program verification check, adding an indication of the first block to a bad block data structure associated with retired blocks; and
 responsive to determining that the second block fails the failure verification operation, removing the indication of the first block from the bad block data structure.

10. The method of claim 8, wherein performing the failure verification operation comprises performing a data integrity check on the second block.

11. The method of claim 8, wherein performing the failure verification operation comprises:
 programming data to the first block and a third block; and
 performing a program verification check on the first block and the third block.

12. The method of claim 11, further comprising:
 responsive to determining that the first block and the third block pass the program verification check, determining that the second block fails the failure verification operation.

13. The method of claim 8, further comprising:
 responsive to determining that the first block fails the program verification check, retiring the first block and the second block.

14. The method of claim 8, further comprising:
 responsive to determining that the second block passes the failure verification operation, resetting the counter value.

15. A non-transitory computer-readable storage medium comprising instructions that, when executed by a processing device, cause the processing device to perform operations comprising:
 performing a set of write operations on a first block in a first plane of a memory device and on a second block in a second plane of the memory device;
 performing a program verification check on the first block;
 responsive to determining that the first block fails the program verification check, incrementing a counter value associated with the second block;
 responsive to the counter value satisfying a threshold criterion, performing a failure verification operation on the second block; and
 responsive to the failure verification operation identifying that the second block is defective, retiring the second block.

16. The non-transitory computer-readable storage medium of claim 15, wherein the processing device is to perform further operations comprising:
 responsive to determining that the first block fails the program verification check, adding an indication of the first block to a bad block data structure associated with retired blocks; and
 responsive to determining that the second block fails the failure verification operation, removing the indication of the first block from the bad block data structure.

17. The non-transitory computer-readable storage medium of claim 15, wherein performing the failure verification operation comprises performing a data integrity check on the second block.

18. The non-transitory computer-readable storage medium of claim 15, wherein performing the failure verification operation comprises:
 programming data to the first block and a third block; and
 performing a program verification check on the first block and the third block.

19. The non-transitory computer-readable storage medium of claim 18, wherein the processing device is to perform further operations comprising:
 responsive to determining that the first block and the third block pass the program verification check, determining that the second block fails the failure verification operation.

20. The non-transitory computer-readable storage medium of claim 15, wherein the processing device is to perform further operations comprising:
 responsive to determining that the first block fails the program verification check, retiring the first block and the second block.

\* \* \* \* \*